(12) United States Patent
Tihanyi

(10) Patent No.: US 6,284,604 B1
(45) Date of Patent: Sep. 4, 2001

(54) METHOD FOR PRODUCING A FIELD-EFFECT-CONTROLLABLE, VERTICAL SEMICONDUCTOR COMPONENT

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/314,192

(22) Filed: May 19, 1999

Related U.S. Application Data

(62) Division of application No. 08/933,537, filed on Sep. 19, 1997, now Pat. No. 5,945,708.

(30) Foreign Application Priority Data

Sep. 19, 1996 (DE) .............................................. 196 38 438

(51) Int. Cl.⁷ .................................................. H01L 21/336
(52) U.S. Cl. ........................ 438/268; 438/270; 438/272; 257/331
(58) Field of Search ......................... 257/331; 438/268, 438/270, 272

(56) References Cited

U.S. PATENT DOCUMENTS

| | | | |
|---|---|---|---|
| 3,646,409 | 2/1972 | Van Der Water et al. | 257/675 |
| 4,446,476 | * 5/1984 | Isaac et al. | 257/770 |
| 4,791,462 | * 12/1988 | Blanchard et al. | 257/260 |
| 4,835,586 | * 5/1989 | Cogan et al. | 257/260 |
| 5,021,845 | 6/1991 | Hashimoto | 257/331 |
| 5,023,196 | * 6/1991 | Johnsen et al. | 438/270 |
| 5,488,236 | * 1/1996 | Baliga et al. | 257/132 |
| 5,539,238 | 7/1996 | Malhi | 257/510 |
| 5,623,152 | 4/1997 | Majumdar et al. | 257/330 |

FOREIGN PATENT DOCUMENTS 39 32 621 A1   4/1990   (DE) .

* cited by examiner

Primary Examiner—Richard Elms
Assistant Examiner—Christian D. Wilson
(74) Attorney, Agent, or Firm—Herbert L. Lerner; Laurence A. Greenberg; Werner H. Stemer

(57) ABSTRACT

A field-effect-controllable, vertical semiconductor component, and a method for producing the semiconductor component include a semiconductor body having at least one drain zone of a first conduction type, at least one source zone of the first conduction type, at least one gate electrode insulated from the entire semiconductor body by a gate oxide, and a bulk region of the first conduction type. A source terminal is located on the rear side of the wafer, and a drain terminal and a gate terminal are located on the front side of the wafer.

1 Claim, 5 Drawing Sheets

METHOD FOR PRODUCING A FIELD-EFFECT-CONTROLLABLE, VERTICAL SEMICONDUCTOR COMPONENT

This application is a divisional application of application Ser. No. 08/933,537, filed on Sep.19, 1997, now U.S. Pat. No. 5,945,708.

BACKGROUND OF THE INVENTION

FIELD OF THE INVENTION

The invention relates to a field-effect-controllable, vertical semiconductor component, including a semiconductor body, at least one drain zone of a first conduction type, at least one source zone of the first conduction type, at least one gate electrode insulated from the entire semiconductor body by a gate oxide, and a bulk region of the first conduction type. The invention also relates to a method for producing a field-effect-controllable, vertical semiconductor component.

Field-effect-controllable semiconductor components of that kind are, for example, MOS field-effect transistors (MOSFETs) Such MOSFETs have been known for a long time and are described, for example, in the Siemens-Datenbuch [Data Manual] 1993/94 SIPMOS-Halbleiter, Leistungstransistoren und Dioden [SIPMOS Semiconductors, Power Transistors and Diodes], pp. 29 ff. FIG. 4 on page 30 of that data manual shows the basic layout of a power transistor of that kind. The transistor shown there is a vertical n-channel SIPMOS transistor. In such a transistor, the n$^+$ substrate serves as a carrier with the drain metallizing beneath it. Above the n$^+$ substrate, an n-epitaxial layer follows, which is variously thick and correspondingly doped depending on the depletion voltage. The gate over that, made of n$^+$ polysilicon, is embedded in insulating silicon dioxide and acts as an implantation mask for the p well and the n$^+$ source zone. The source metallizing covers the entire structure and connects the individual transistor cells of the chip in parallel. Further details of that vertically constructed power transistor can be found on pages 30 ff. of the aforementioned data manual.

A disadvantage of such a configuration is that the on-state resistance $R_{on}$ of the drain-to-source load path increases with increasing dielectric strength of the semiconductor component, since the thickness of the epitaxial layer necessarily increases. At 50V, the on-state resistance $R_{on}$ per unit of surface area is approximately 0.20 $\Omega mm^2$, and rises at a depletion voltage of 1000V to a value of approximately 10 $\Omega mm^2$, for instance.

In contrast to lateral MOSFETs, vertical MOSFETs have a substantially vertical current flow direction. That causes the current to flow from the front side of the wafer to the rear side of the wafer. In vertical MOSFETs of that generic type, the source and gate terminals are located on the front side of the wafer, while the drain terminal is contacted through the rear side of the wafer. As a result, vertical MOSFETs have the advantage over lateral MOSFETs of being integratable on the semiconductor chip in a space-saving way, and therefore the components can be manufactured less expensively.

Vertical MOSFETs are typically secured by the rear side of the wafer to a cooling body or to the device housing. One disadvantage of such a configuration is that an insulating layer must be applied between the drain rear side contact and the cooling body, which typically is at the potential of the device ground. The insulating layer increases the heat resistance between the drain rear side contact and the cooling body. That leads to reduced heat dissipation through the rear side of the wafer.

SUMMARY OF THE INVENTION

It is accordingly an object of the invention to provide a field-effect controllable, vertical semiconductor component and a method for producing the same, which overcome the hereinafore-mentioned disadvantages of the heretofore-known devices and methods of this general type.

With the foregoing and other objects in view there is provided, in accordance with the invention, a field-effect-controllable, vertical semiconductor component, comprising a semiconductor body having front and rear wafer sides; at least one drain zone of a first conduction type; at least one source zone of the first conduction type; at least one gate electrode; a gate oxide insulating the at least one gate electrode from the entire semiconductor body; and a bulk region of the first conduction type; a source terminal disposed on the rear wafer side; and a drain terminal and a gate terminal disposed on the front wafer side.

In accordance with another feature of the invention, the source terminal is secured to a cooling body, in particular a copper block. This makes the heat resistance between the source contact and the cooling body less by approximately a factor of 5. Improved heat dissipation through the rear side of the wafer is thereby made possible in particular because of the very good thermal conductivity of copper. This allows even further miniaturization of the components according to the invention.

In accordance with a further feature of the invention, other embodiments of the vertical MOSFETs are provided. Vertical trenches are provided that are filled with conductive material. Titanium nitride, highly doped polysilicon, metal silicide, or metal is preferably used as the conductive material, all because of their good conductivity. The trenches short-circuit the source zones on the front side of the wafer with the bulk region on the rear side of the wafer. The current is therefore conducted at low impedance from the front side of the wafer to the source terminal on the rear side of the wafer. An important feature in this case is that the bulk region is doped highly enough to assure a low-impedance connection between the front side of the wafer and the rear side of the wafer.

In accordance with an added feature of the invention, there are provided vertical intercell zones, in which gate electrodes and the gate oxide are located. The gate electrode is shifted into the semiconductor body, and as a result MOSFETs with high breakdown voltages and at the same time a low turn-on resistance $R_{on}$ can advantageously be realized.

In accordance with an additional feature of the invention, there are provided ion-implanted, highly doped channel zones under the intercell zones. The turn-on voltage of the channel of the MOSFET can be adjusted in a targeted way through the use of this so-called channel implantation.

In accordance with yet another feature of the invention, there are provided contact regions in the drain zones. The contact regions for the drain terminals must have an adequately high dopant concentration to assure an ohmic contact between the semiconductor and the metallizing. An exactly determinable doping dose can be introduced and thus the desired dopant concentration can be adjusted within the desired ranges through the use of ion implantation.

In accordance with yet a further feature of the invention, polysilicon is used as gate material of the gate electrode, because from a process technology standpoint it is easy to handle and it has good conductivity.

With the objects of the invention in view, there is also provided a method for producing a field-effect-controllable, vertical semiconductor component, which comprises the following steps: depositing various epitaxial layers of an inner zone on a bulk region of a semiconductor body; epitaxially depositing drain and source zones on the inner zone; structuring a front wafer side, and introducing contact regions and highly doped source regions by ion implantation; structuring the front wafer side again, and anisotropically etching intercell zones; introducing channel zones by ion implantation using an etching mask; thermally applying a thin silicon dioxide layer as a gate oxide to trench walls of the intercell zones using the etching mask, filling the intercell zones with polysilicon as a gate material, etching excess polysilicon out of the intercell zones, and filling the intercell zones with silicon dioxide as a gate material; structuring the front wafer side once again, and anisotropically etching trenches down to a depth of the bulk zone in the region of the source zones; applying a thin oxide to walls of the trenches, and filling the trenches with conductive material; metallizing a source terminal over a large surface area on a rear wafer side; metallizing a drain terminal and a gate terminal on the front wafer side at corresponding contacts and insulating the drain and gate terminals from one another with an intermediate oxide; and conductively securing the source terminal to a cooling body with a solder.

Other features which are considered as characteristic for the invention are set forth in the appended claims.

Although the invention is illustrated and described herein as embodied in a field-effect controllable vertical semiconductor component and a method for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
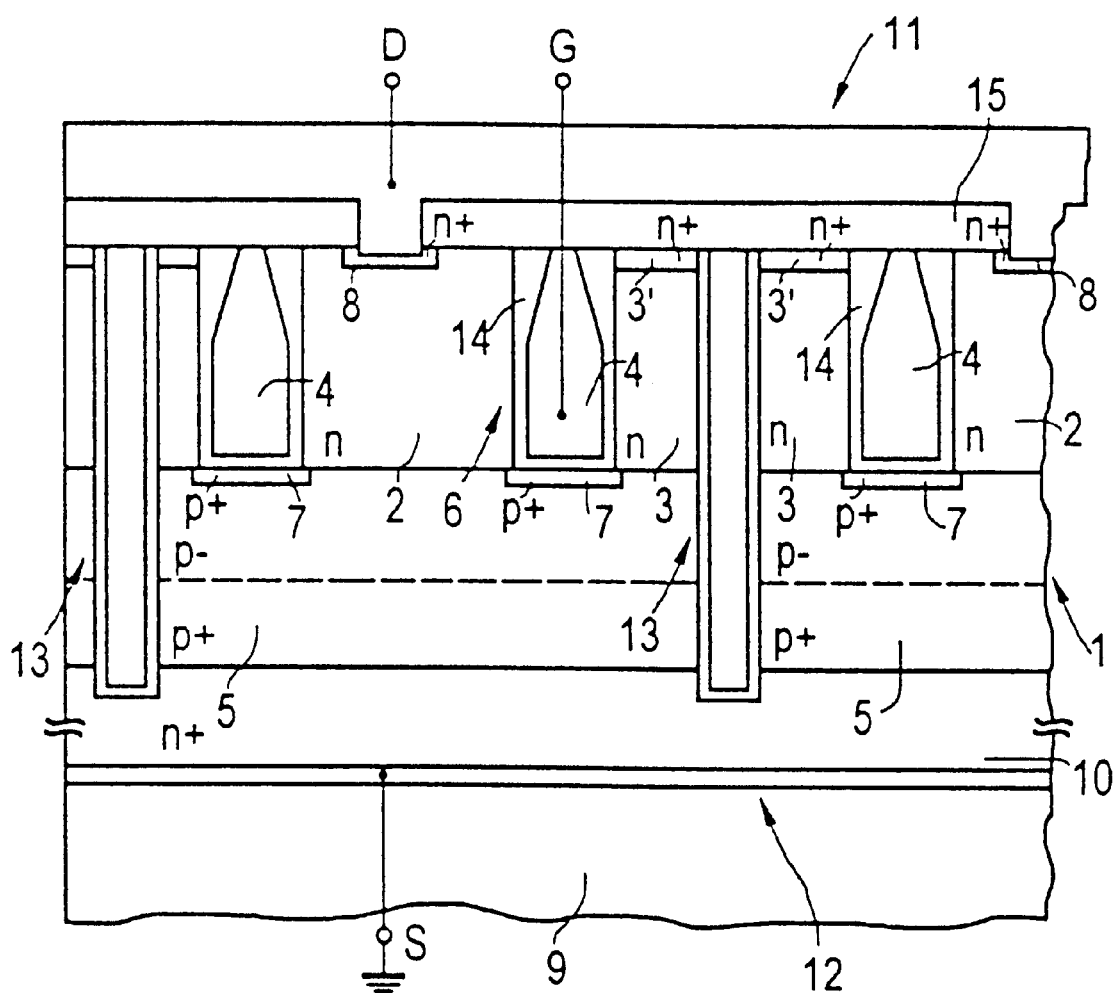
FIG. 1 is a fragmentary, diagrammatic, sectional view of an exemplary embodiment of a vertical MOSFET according to the invention.

Referring now to the figures of the drawing and first particularly to FIG. 1, there is shown an exemplary embodiment of a vertical MOSFET according to the invention, with a source terminal on a rear side of a wafer. A semiconductor body 1, for instance a silicon wafer, is n$^+$-doped. The untreated semiconductor body 1 at the same time forms a bulk zone 10. One p$^+$-doped and one p-doped layer are applied epitaxially in succession on the bulk zone 10 at a front side 11 of the wafer. These layers will be referred to below as an inner zone 5. Drain zones 2 and source zones 3, which are likewise applied epitaxially, are located above the inner zone 5. The drain zones 2 and the source zones 3 have the same doping, which in the present case is n-doping. The dopant concentrations in the drain zones 2 and the source zones 3 should, but need not necessarily, be the same.

The drain zones 2 and the source zones 3 are spaced apart from one another and the spacings between one drain zone 2 and one source zone 3 are defined in each case by one intercell zone 6. The intercell zones 6 take the form of trenches extending vertically into the semiconductor body 1. These trenches extend from the front side 11 of the wafer of the semiconductor body 1 vertically beyond the drain zone 2 and the source zone 3 into the inner zone 5 of the semiconductor body 1. The intercell zones 6 should, but need not necessarily, extend as far as the inside of the inner zone 5. Conversely, the course of the depth can be chosen freely.

The intercell zones 6 include gate electrodes 4. The gate electrodes 4 are connected to a gate terminal G. Highly doped polysilicon is preferably used as gate material, because of its easy handling in process technology and its good conductivity. As an alternative, titanium nitride or a metal silicide can be used as the gate oxide, because of their good conductivity. The gate electrodes 4 are insulated from the adjoining drain zones 2 and source zones 3 or inner zone 5 by a gate oxide 14. The gate electrodes 4 may be shaped variously, depending on need. In the present case, the gate electrodes 4 have the shape of a bottle that narrows toward the top. Thermally grown silicon dioxide is preferentially used as the gate oxide 14. It can be especially advantageous for an apex region or turning point of the intercell zone trenches 6 to be made U-shaped instead.

The drain zones have embedded n$^+$-doped regions and form contact regions 8. The contact regions 8 are electrically contacted through a typical metallizing. The drain contacts are short-circuited in their entirety and form a drain terminal D. As a result, the many identical MOSFETs are connected parallel, which enables a further increase in the controllable power. The drain contacts are insulated from the gate terminals G by an intermediate oxide 15. The source zones 3 also have embedded n$^+$-doped regions 3'. According to the invention, vertical trenches 13 are etched into the source zones 3'. These vertical trenches 13 contain conductive material which at least partially includes doped polysilicon, titanium nitride, or metal. The vertical trenches 13 form a short circuit between the n$^+$-doped source regions 3'.

The bulk zone 10 is contacted over a large surface area through a conventional metallizing on a rear side 12 of the wafer. This metallizing forms a source terminal S.

Advantageously, p+-doped regions 7 are introduced in the inner zone 5 directly below the intercell zones 6. These regions will be referred to below as channel zones 7. The technological step on which this is based is known generally as channel doping. In channel doping, the turn-on voltage for the MOSFETs can be defined accurately by introducing an exactly determinable dopant concentration. In channel doping, the etched intercell zones 6, in which the gate electrode 4 and gate oxide 14 have not yet been introduced, can be advantageously used as an implantation mask. It is also conceivable for the channel zone 7 to be formed by a thin p$^+$-doped epitaxial layer between the inner zone 5 and the drain and source zones 2, 3.

When a gate voltage is applied to the gate electrodes 4, the flow of current is from the source terminal S on the rear side 12 of the wafer through the bulk zone 10 and the vertical trenches 13 to the n$^+$-doped source regions 3'. The current flows from there, through the channel that has formed, under the intercell zones 6 to the drain region 2 and therefore to the drain terminal D.

The source terminal S is secured without an insulating layer to a cooling body or device housing 9 on the rear side 12 of the wafer. The ground potential of the source zone is thus equal to the potential of the device ground. A copper block is preferably used as the cooling body 9. This assures rapid heat dissipation from the semiconductor body 1 due to the very high thermal conductivity of copper.

The MOSFETs shown in the figure are designated as self-blocking n-channel MOSFETs. The conduction types of the drain and source zones 2, 3 and the channel zone 7 differ. It is understood that the MOSFETs of the invention may also be realized as self-conducting transistors. For that purpose, the conduction type of the channel zone 7 must be identical to the conduction type of the drain and source zones 2, 3. However, in these self-conducting MOSFETs, the channel zone 7 must touch the drain and source zones 2, 3. If the drain and source zones 2, 3 are p-doped and the bulk region is n-doped, then p-channel MOSFETs can correspondingly be made as well.

Figure 2:
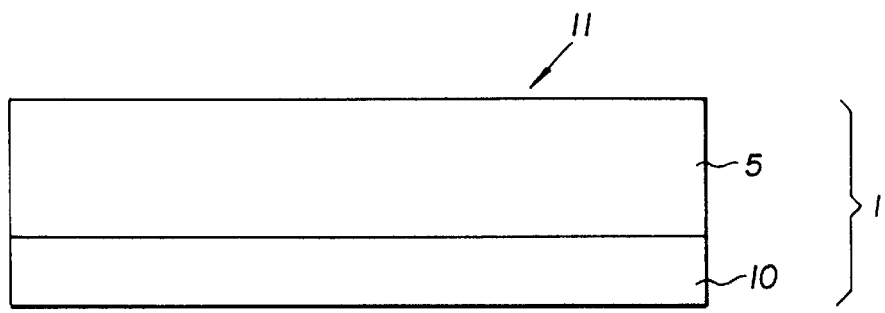
FIGS. 2–12 illustrate various production steps used to manufacture the vertical MOSFET shown in FIG. 1.
Figure 3:
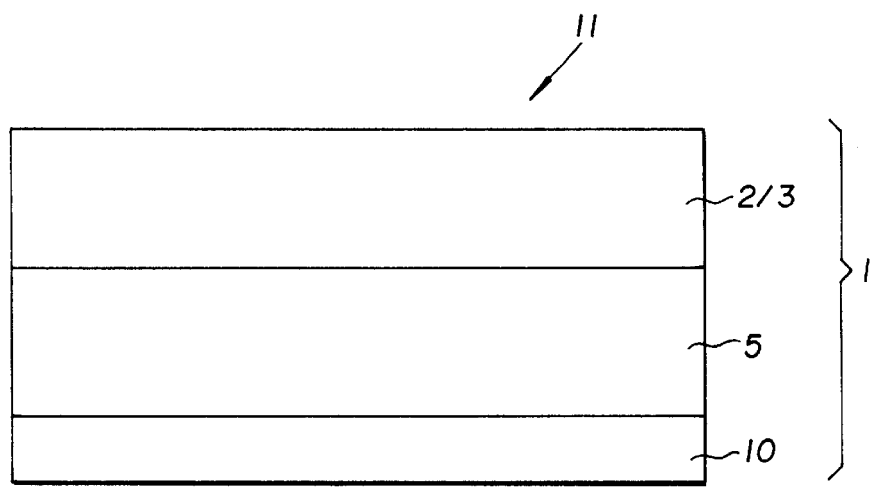
Figure 4:
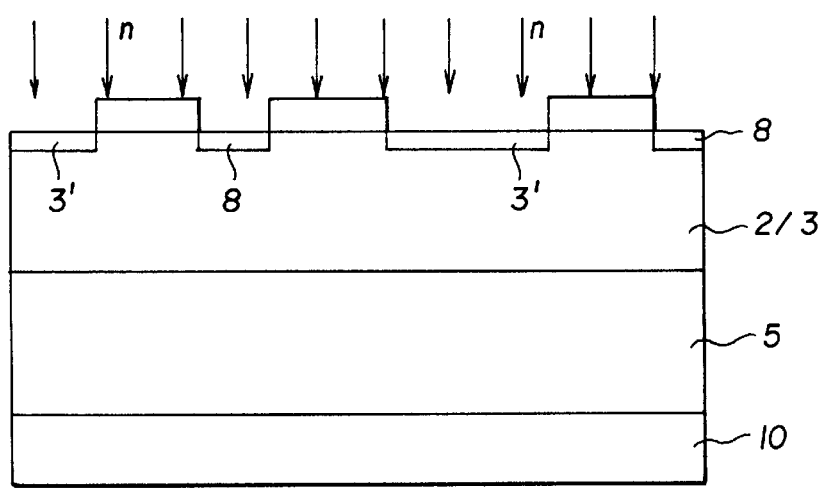
Figure 5:
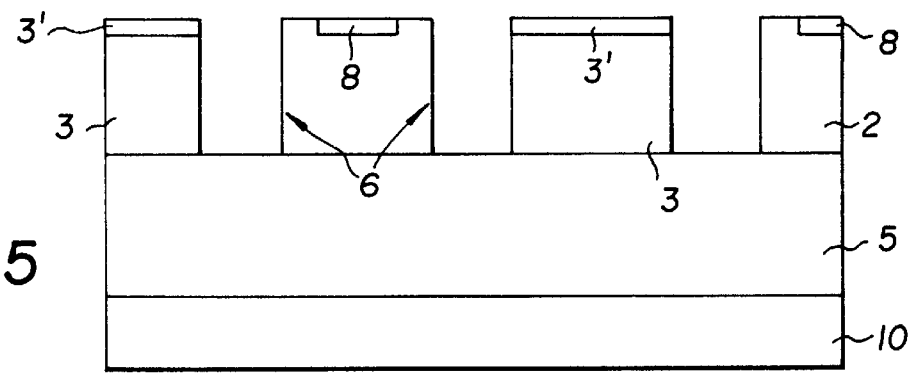
Figure 6:
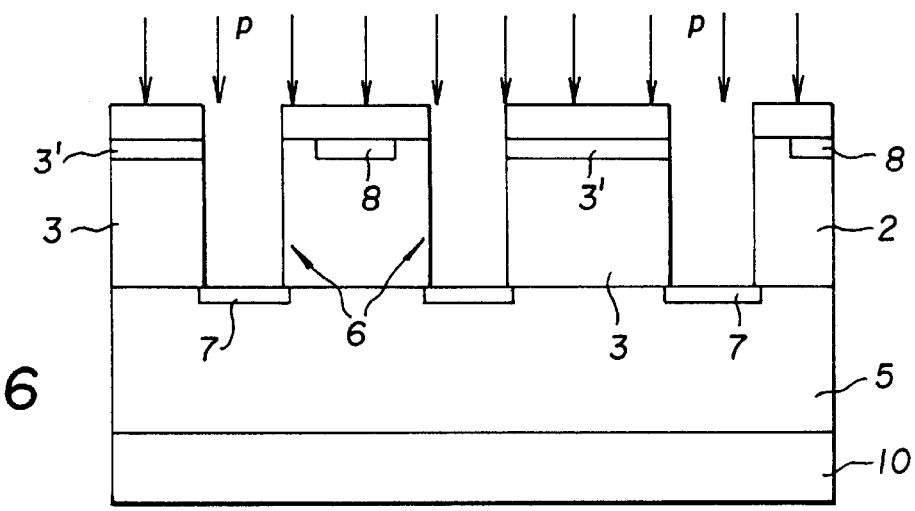
Figure 7:
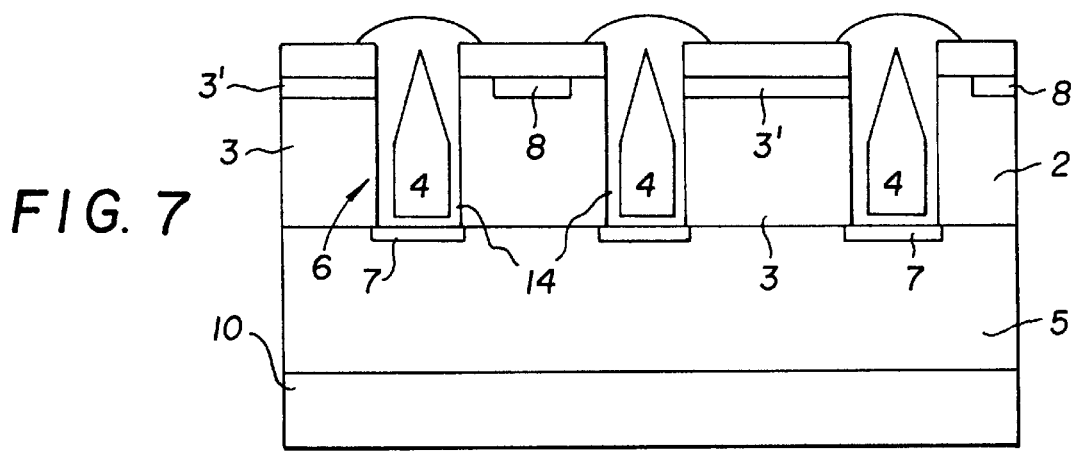
Figure 8:
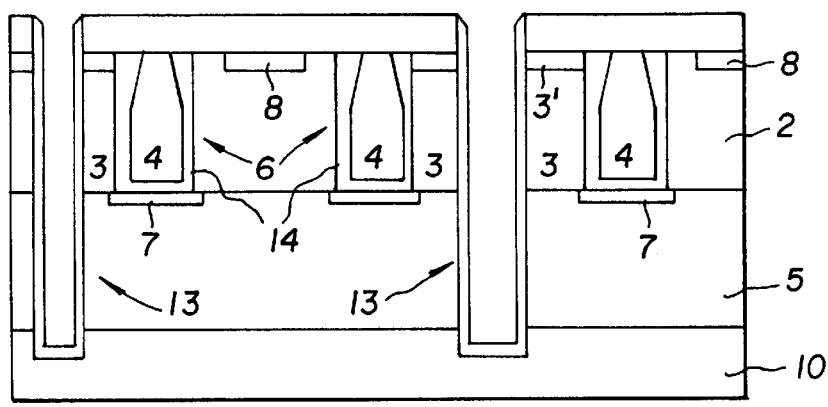
Figure 9:
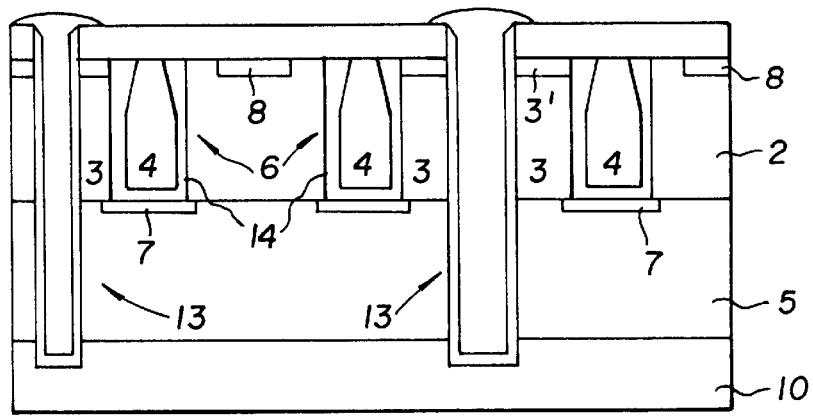
Figure 10:
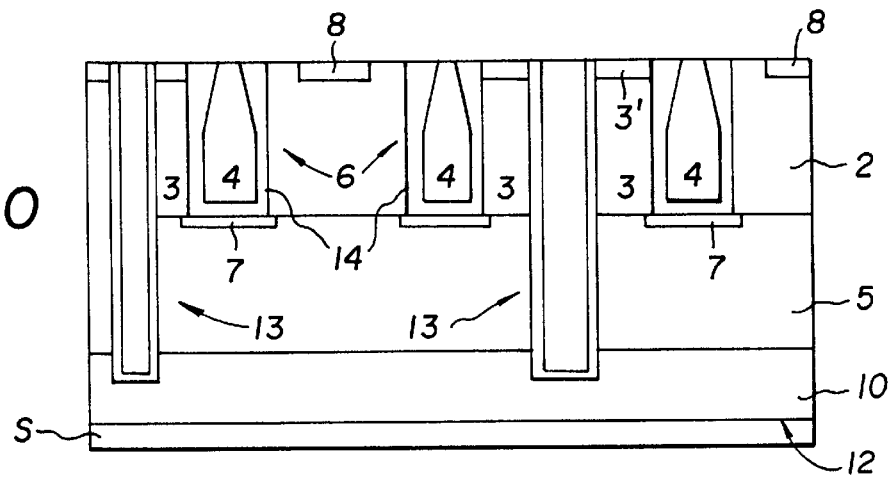
Figure 11:
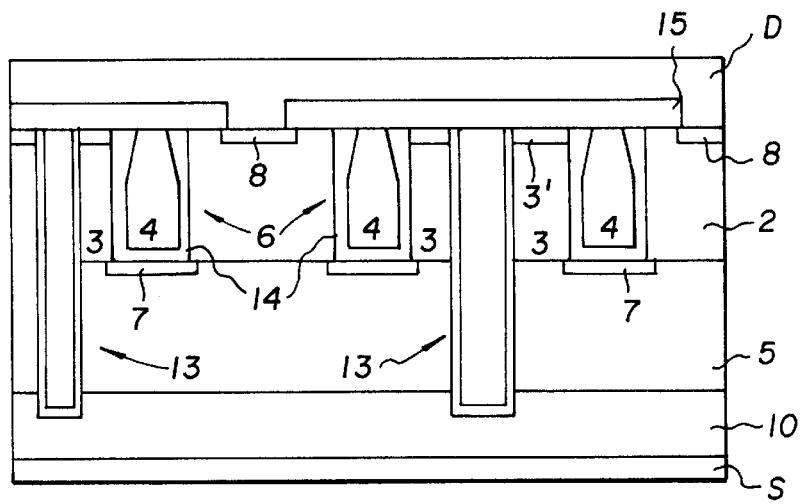
Figure 12:
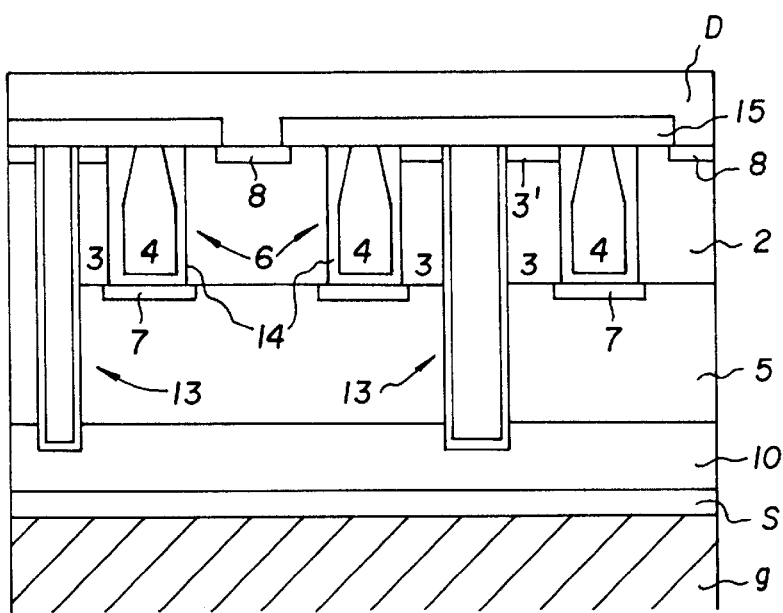

One possible production method for the power MOSFETs according to the invention will be described below in conjunction with the figure. The following production steps are performed:

The $p^+$-doped and $p^-$-doped layers of the inner zone 5 and the drain and source zones 2, 3 are applied epitaxially in succession on the semiconductor body 1, which at the same time forms the bulk zone 10 as can be seen by referring to FIGS. 2 and 3. The front side 11 of the wafer is structured, and the contact regions 8 of the drain zones 2 and the highly doped source regions 3' are introduced by ion implantation, as shown in FIG. 4. The front side 11 of the wafer is structured once again, and the intercell zones 6 are etched anisotropically, as shown in FIG. 5. The $p^+$-doped regions 7 are introduced in the inner zone 5 by ion implantation using the existing etching mask as shown in FIG. 6. Next, a thin thermal layer of silicon dioxide is applied as the gate oxide 14 into the intercell zones 6, as shown in FIG. 7. The intercell zones 6 are filled with doped polysilicon as a material for the gate electrodes 4. Excess polysilicon is etched out of the intercell zones 6, and the intercell zones 6 are filled with silicon dioxide. The front side 11 of the wafer is structured yet again, and the trenches 13 are etched anisotropically down to the depth of the bulk zone 10, as shown in FIG. 8. A thin oxide is applied on the walls of the further trenches 13, and the trenches 13 are filled with titanium nitride or doped polysilicon, as shown in FIG 9. The source terminal S on the rear side 12 of the wafer is metallized over a large surface area, as shown in FIG. 10. The front side of the wafer 11 is structured, and the drain terminals D and gate terminals G are metallized at the corresponding contacts and insulated from one another by the intermediate oxide 15, as shown in FIG. 11. The source terminal S is secured to the cooling body 9 through a conductive solder, as shown in FIG. 12.

There is one substantial advantage of MOSFETs according to the invention with the source terminal on the rear side of the wafer: Improved power loss dissipation through the rear side of the wafer, which is connected to a cooling body, is possible with these so-called source-down transistors, as compared with drain-down transistors. Since no insulating layer is needed between the source contact and the cooling body in source-down transistors, the heat resistance is less by a factor of approximately 5. As a result, the corresponding semiconductor components can be even further miniaturized.

I claim:

1. A method for producing a field-effect-controllable, vertical semiconductor component, which comprises the following steps:

depositing various epitaxial layers of an inner zone on a bulk region of a semiconductor body;

epitaxially depositing drain and source zones on the inner zone;

introducing contact regions and highly doped source regions by ion implantation;

after introducing the contact regions and the highly doped source regions, anisotropically etching intercell zones;

introducing channel zones by ion implantation using an etching mask;

thermally applying a thin silicon dioxide layer as a gate oxide to trench walls of the intercell zones using the etching mask, filling the intercell zones with polysilicon as a gate material, etching excess polysilicon out of the intercell zones, and filling the intercell zones with silicon dioxide as a gate material;

structuring the front wafer side once again, and anisotropically etching trenches down to a depth of the bulk zone in the region of the source zones;

applying a thin oxide to walls of the trenches, and filling the trenches with conductive material;

metallizing a source terminal over a large surface area on a rear wafer side;

metallizing a drain terminal and a gate terminal on the front wafer side at corresponding contacts and insulating the drain and gate terminals from one another with an intermediate oxide; and conductively securing the source terminal to a cooling body with a solder.

* * * * *